(12) United States Patent
Ricotti et al.

(10) Patent No.: US 8,035,423 B2
(45) Date of Patent: Oct. 11, 2011

(54) DRIVING CONFIGURATION OF A SWITCH

(75) Inventors: Giulio Ricotti, Broni (IT); Riccardo Depetro, Domodossola (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 37 days.

(21) Appl. No.: 12/347,517

(22) Filed: Dec. 31, 2008

(65) Prior Publication Data
US 2010/0164582 A1    Jul. 1, 2010

(51) Int. Cl.
*H03K 3/00* (2006.01)
*H01L 27/06* (2006.01)

(52) U.S. Cl. ........................................ 327/108; 257/533

(58) Field of Classification Search .................. None
See application file for complete search history.

(56) References Cited

U.S. PATENT DOCUMENTS

| | | | |
|---|---|---|---|
| 4,801,821 A | 1/1989 | Prevost et al. | |
| 5,434,446 A * | 7/1995 | Hilton et al. | 257/503 |
| 5,635,821 A | 6/1997 | Smith | |
| 6,355,537 B1 * | 3/2002 | Seefeldt | 438/405 |
| 6,473,282 B1 * | 10/2002 | Lin et al. | 361/90 |
| 6,759,888 B1 | 7/2004 | Wodnicki | |
| 6,967,522 B2 * | 11/2005 | Chandrakasan et al. | 327/534 |
| 7,271,449 B2 * | 9/2007 | Misaki et al. | 257/368 |
| 7,304,530 B2 * | 12/2007 | Wei et al. | 327/536 |
| 2007/0085151 A1 * | 4/2007 | Kotani | 257/393 |
| 2007/0273427 A1 * | 11/2007 | Ricotti | 327/427 |
| 2007/0278554 A1 * | 12/2007 | Song et al. | 257/314 |
| 2007/0297254 A1 * | 12/2007 | Rosal et al. | 365/201 |
| 2009/0184744 A1 * | 7/2009 | Ricotti et al. | 327/218 |

* cited by examiner

*Primary Examiner* — Lincoln Donovan
*Assistant Examiner* — Khareem E Almo
(74) *Attorney, Agent, or Firm* — Lisa K. Jorgenson; Robert Iannucci; Seed IP Law Group PLLC

(57) ABSTRACT

A circuit includes a switch, having first and second transistors, and a driving device for driving the switch. A latch circuit, coupled between respective common gate and source terminals of the first and second transistors, supplies the common gate terminal with first and second control signals to turn off and on the first and second transistors. The latch circuit comprises a flip-flop coupled to the common source terminal and having a reset terminal coupled to the common source terminal by a reset resistance, a set terminal coupled to the common source terminal by a set resistance and an output terminal coupled to the common gate terminal. The latch circuit further includes an activation circuit connected to the set and reset terminals of the flip-flop and to the common source terminal to dynamically short-circuit the set and reset resistances during the falling edges of the signal applied to the switch.

26 Claims, 12 Drawing Sheets

DRIVING CONFIGURATION OF A SWITCH

BACKGROUND

1. Technical Field

The present disclosure relates to the driving configuration of a switch and, more specifically, to a driving configuration of a switch realized by means of a first and a second transistor connected in series to each other and to the relative intrinsic diodes in antiseries and driven by a driving device, including, without limitation, a driving configuration of a high voltage (HV) switch.

2. Description of the Related Art

As is well known, a driving device of a high voltage (HV) switch, usually realized by means of a MOS transistor, is specified to instantaneously follow the voltage dynamics of a signal to be switched.

In general, a switch realized by means of a high voltage MOS or DMOS transistor is able to manage high voltages between its drain and source terminals, as well as with respect to a substrate potential. The highest voltage value Vgs between its gate and source terminals is however limited to some volts (3V or 5V).

In particular, when the switch is off it should be able to interrupt the passage of current independently from the voltage polarity at its ends. Further to the connection of the body terminal to the source terminal, a junction is created between the source and drain terminals, which prevents the inversion of the polarity across the switch without triggering a passage of current in the intrinsic diode thus created even if the relative channel is off.

To overcome this drawback, the switch is realized by placing two MOS or DMOS transistors in series, so that the relative intrinsic diodes are biased in antiseries, i.e., with a pair of corresponding terminals, in particular respective anodes, in common. In this way, at least one intrinsic diode of the switch is always inversely biased.

In this case a driving device or driver is to be provided that is able to follow a turn on/off command of the switch and to apply a first turn on voltage value (for example equal to 5V) between the gate and source terminals of the transistors contained in the switch when the switch itself is to be turned on and a second turn off voltage value (for example equal to 0V) between the gate and source terminals of the transistors contained in the switch when it is to be turned off.

Schematically shown in FIG. 1 is a configuration 5 of a driven switch including a switch 1 realized by means of two DMOS transistors, DM1, DM2, connected in series with intrinsic diodes in antiseries and driven by means of a driving device or driver 2.

In particular, this configuration 5 has a resistive element Rgs that connects respective common source SS and gate GG terminals of the DM1 and DM2 transistors of the switch 1. The DM1 and DM2 transistors also have respective drain terminals, D1 and D2.

The driver 2 is inserted between a first and a second voltage reference, respectively a supply Vss (for example equal to 3.3V) and a ground GND (for example equal to 0V), and it has an input terminal IN receiving a driving signal Sin for driving the switch 1 in a first on state (ON) and in a second off state (OFF). In particular, the driving signal Sin is a digital signal having a first level or 0 logic corresponding to a demand for turn on of the switch 1 and a second level or 1 logic corresponding to a demand for turn off of the switch 1.

The driver 2 also has an output terminal, OUT, connected, by means of a level shifter 3 to the gate terminals GG of the switch 1. On the output terminal OUT of the driver 2 there is a control signal Sc for the switch 1, derived from the driving signal Sin applied to its input terminal IN In fact, it is to be emphasized that in high voltage applications the voltage value at the drain and source terminals of the transistors in the switch 1 must take all the values between a negative −HV and a positive +HV high voltage reference, for example equal to 100V and a level shifter 3 is thus to be used. The shifter is able to shift a control signal Sc referred to the ground GND and to refer it to an instantaneous level of a signal Scomm to be switched and applied to a terminal of the switch 1, in particular to the D1 and D2 drain terminals.

As shown in FIG. 1, the level shifter 3 is realized in a simple and functional way so as to convert the control signal Sc in voltage (referred to the GND) into a control signal in current and then again into a control signal Scd derived in voltage referred to the common source terminals SS of the DM1 and DM2 transistors comprised in the switch 1.

For realizing this conversion, the level shifter 3 includes a first transistor M1 having a control or gate terminal connected to the output terminal OUT of the driver 2, a first conduction terminal, in particular a source terminal, connected, by means of the parallel of a current generator CSG (in particular a low voltage one) and of a capacitor Cff (so called feed forward capacitor), to the GND, as well as a second conduction terminal, in particular a drain terminal, connected to a shifted voltage reference VPP (equal to a high voltage value, for example +3V) by means of a current mirror realized by a second M2 and a third M3 transistor.

In particular, the second transistor M2 is inserted between the shifted voltage reference VPP and the drain terminal of the first transistor M1, it is diode configured, and it has a gate terminal connected to the gate terminal of the third transistor M3, in turn inserted between the shifted voltage reference VPP and an output terminal OUT* of the level shifter 3, in turn connected to the gate terminals GG of the switch 1.

Although advantageous under several aspects, this known configuration shows a serious drawback linked to the sizing of the resistive element Rgs inserted between the common gate GG and the source SS terminals of the DM1 and DM2 transistors of the switch 1.

In fact, if the switch 1 is to be switched quickly, this resistive element Rgs is to be sized with a relatively small value so that the time constant τ given by the resistive element Rgs itself and by the parasitic capacitances Cpar associated with the gate nodes is brief and smaller than a switch time Tcomm (in this case, a turn off time) as desired. In particular, it results in:

$$\tau = Rgs * Cpar < Tcomm \qquad (1)$$

Thus, by using a small resistance value for the resistive element Rgs so as to meet the above reported relation (1), a high current value Ion is however to be provided during the turn on, this current value having in fact to meet, for the voltage between the gate and source terminals of the DM1 and DM2 transistors, the following relation:

$$Vgs = Rgs * Ion = 5V \qquad (2)$$

In other words, the configuration 5 shown in FIG. 1 must use a variable resistance being small when the switch 1 is off and high when it is on.

Such a configuration 5, using a resistive element Rgs of 500 kOhm, has been simulated in which the switch 1 connects a load to a source of a voltage signal Vs. The results of this simulation are shown in FIGS. 2A, 2B, and 2C. In particular, FIG. 2A shows a control signal Sc of the switch 1, for which a void voltage value (Sc=0) corresponds to a condition of open switch, and a voltage value equal to Vpp (Sc=5V) corresponds to a condition of closed switch. FIG. 2B shows the supply voltage signal Vpp, the source voltage signal Vs, and the voltage signal that is obtained on the load Vload, overlapped onto each other, while FIG. 2C reports the signal on the load Vload only. Thus, the switch 1 works correctly and reports the source voltage value Vs on the load (Vload signal overlapped onto Vs in FIG. 2B) as soon as the control signal Sc is brought to Vpp (turn on of the switch 1). This switch 1 does not however work correctly during the turn off (Sc is brought back to 0) since the voltage signal on the load Vload dampens only gradually starting from 20 microseconds (time in which the control signal Sc is interrupted in FIG. 2C), the turn off being relied only upon the resistive element Rgs. From these results, it is immediate to verify how such a value of the resistive element Rgs thus implies a long turn off time of the switch 1.

The technical problem is that of providing a driving configuration of a high voltage switch able to associate, with a quick switch transient, a reasonable control current value while overcoming the limits and drawbacks still affecting the configurations realized according to the foregoing description.

BRIEF SUMMARY OF THE INVENTION

The present disclosure is directed to introducing between the gate and source terminals of a switch driven by a driver, a latch circuit able to realize a correct connection of these gate terminals to suitable current values according to the working conditions of the switch itself, in particular during turn on and off conditions.

In accordance with one embodiment of the present disclosure, a driving circuit is provided for a switch that includes first and second transistors coupled in series to each other and to relative intrinsic diodes in antiseries and driven by the driving circuit, the driving circuit including at least one first and one second output terminal coupled to the switch and configured to supply the switch with a first control signal for driving said switch in a first working state and a second control signal for driving said switch in a second working state, and in that it includes at least one latch circuit coupled between respective common gate and source terminals of said first and second transistors and configured to supply said common gate terminal with said first and second control signals, respectively, according to said working state for the turn off, and respectively the turn on, of said first and second transistors.

In accordance with another aspect of the foregoing embodiment, the driving circuit includes at least one first and one second generator of the control signals connected by respective first and second switches driven by respective control signals to the first and second output terminals of the driving device.

In accordance with another aspect of the foregoing embodiment, the latch circuit includes at least one first and one second latch transistor coupled between the common gate and source terminals and coupled in positive reaction to each other, the first latch transistor coupled between the first output terminal of the driving device and the common source terminal and having a gate terminal coupled to the common gate terminal, and the second latch transistor coupled between the second output terminal of the driving device, in turn coupled to the common gate terminal, and the common source terminal, and having a gate terminal coupled to the first output terminal of the driving device.

In accordance with another aspect of the foregoing embodiment, the latch circuit includes respective clamp circuits coupled between the first and second gate terminals, respectively, and the common source terminals. Ideally, each clamp circuit includes at least one Zener diode and one capacitor coupled in parallel to each other and coupled between the first and second gate terminals and the common source terminal. Preferably, the latch transistors are low voltage N channel MOS transistors.

In accordance with another aspect of the foregoing embodiment, the latch circuit includes at least one flip flop coupled to the common source terminal and having a reset terminal coupled to the first output terminal of the driving device and to the common source terminal by a reset resistance, a set terminal coupled to the second output terminal of the driving device and to the common source terminal by a set resistance, and an output terminal coupled to the common gate terminal.

In accordance with another aspect of the foregoing embodiment, the flip flop is supplied through a circuit node by means of a rectifier coupled to the first and second output terminals of the driving device.

In accordance with another embodiment of the present disclosure, a switch circuit is provided that includes a switch having first and second transistors coupled in series to one another; and a driving circuit coupled to the switch, the driving circuit including a first current source coupled to a first latch transistor and coupled to a control terminal of a second latch transistor; a second current source coupled to the second latch transistor and to a control terminal of the first latch transistor; the first and second latch transistors each coupled to a common source terminal of the first and second transistors; and first and second clamp circuits coupled between the respective control terminals of the first and second latch transistors and the common source terminal.

In accordance with another aspect of the foregoing embodiment, the switch circuit includes first and second current sources coupled to the respective latch transistors by first and second respective switches, the second switch having a control terminal to receive a control signal and the first switch having a control terminal to receive the control signal in an inverted state. Preferably, the circuit includes first and second clamp circuits, each having a Zener coupled in parallel with a capacitor.

In accordance with another embodiment of the present disclosure, a switch circuit is provided that includes a driving circuit having first and second current sources coupled to respective first and second outputs via respective first and second switches, the second switch controlled by a control signal and the first switch controlled by the inverted control signal; and a switch, the switch including first and second transistors coupled in series to each other and to relative intrinsic diodes in antiseries and having a first input coupled to the first output of the driving circuit and a second input coupled to the second output of the driving circuit, the first input coupled to a first terminal of a latch circuit and the second input terminal coupled to a second terminal of the latch circuit, and an output of the latch circuit coupled to control terminals of the first and second transistors, and a fourth terminal coupled to a common source terminal between the first and second transistors, the switch further comprising a clamp circuit coupled to the latch circuit and to the common source terminal.

In accordance with yet another embodiment of the present disclosure, a driving circuit is provided for a switch that includes first and second transistors coupled in series to each other and to relative intrinsic diodes in antiseries and driven by the driving circuit, the driving circuit including at least one first and one second output terminal coupled to the switch and configured to supply the switch with a first control signal for driving said switch in a first working state and a second control signal for driving said switch in a second working state, and in that it includes at least one latch circuit coupled between respective common gate and source terminals of said first and second transistors and configured to supply the common gate terminal with said first and second control signals, respectively, according to said working state for the turn off, and respectively the turn on, of said first and second transistors, wherein the latch circuit comprises at least one flip-flop coupled to the common source terminal and having a reset terminal coupled to the first output terminal of said driving device and to the common source terminal by means of a reset resistance, a set terminal coupled to the second output terminal of the driving device and to the common source terminal by means of a set resistance and an output terminal coupled to the common gate terminal, the latch circuit further including an activation circuit connected to the set and reset terminals of the flip-flop and to the common source terminal in order to dynamically short-circuit the set and reset resistances during the falling edges of the signal applied to the switch.

In accordance with another aspect of the foregoing embodiment, the activation circuit comprises a first MOS transistor inserted between the set terminal and the common source terminal and having a gate terminal connected to an inner circuit node, and a second MOS transistor inserted between the reset terminal and the common source terminal and having a gate terminal connected to the inner circuit node. Preferably, the first and second transistors are low voltage N channel MOS transistors and the inner circuit node is connected to the common source terminal by means of a resistor and a Zener Diode, in parallel to each other.

In accordance with yet another aspect of the foregoing embodiment, the activation circuit further comprises a brake circuit, connected to the inner circuit node and acting as a parachute for the set and reset resistances of said flip-flop, by activating the first and second transistors which allow the set and reset resistances to be short-circuited or dramatically reduced in value. Preferably, the brake circuit is realized by means of an integrated high voltage parasitic capacitor.

In accordance with yet another aspect of the foregoing embodiment, the flip-flop is supplied through a circuit node coupled by means of a rectifier to said first and second output terminals of said driving device. Preferably, said rectifier comprises first and second diodes coupled in counter-series to each other and between said first and second output terminals of said driving device and interconnected to each other in correspondence with said circuit node.

In accordance with yet another aspect of the foregoing embodiment, the driving circuit further comprises a clamp circuit coupled between said circuit node and said common source terminal. Preferably, said clamp circuit comprises at least one Zener diode and one capacitor coupled in parallel to each other and between said inner circuit node and said common source terminal.

In accordance with yet another aspect of the foregoing embodiment, the switch comprises a high voltage switch.

Preferably said first and second transistors are DMOS transistors.

In accordance with another embodiment of the present disclosure, an integrated structure for realizing a driving circuit for a switch of the SOI type is provided which comprises:
 a substrate
 a first well realized in said substrate
 a second well realized within the first well
 said first and second wells having respectively first and second conductivity types, opposite to each other, and
 a switch realized in the second well;
 a driving circuit of said switch realized in a sensitive pocked defined within said second well by a first and a second trench surrounding the second well.

In accordance with another aspect of the foregoing embodiment, the first and second trenches define a first portion and a second portion of the substrate, the first portion being laterally fully isolated by the first and second trenches.

In accordance with yet another aspect of the foregoing embodiment, the integrated structure further comprises an isolation layer, being realized according to the SOI technology in order to fully vertically isolate the first portion.

Preferably, the first and second trenches are made by silicon oxide and have a thickness of 1 µm and the isolation layer is made by silicon oxide and has a thickness of 2 µm.

In accordance with yet another aspect of the foregoing embodiment:
 the second well and the first portion are connected to a local ground line;
 the first well is connected to a local supply line; and
 the second portion is connected to a substrate terminal.

In accordance with yet another aspect of the foregoing embodiment, the integrated structure further comprises a bottom capacitor which is realized by the first well and by the substrate, separated by the isolation layer and connected between the local supply line and the substrate terminal.

Moreover, in accordance with yet another aspect of the foregoing embodiment, the integrated structure further comprises first and second lateral capacitors formed across the first and second trenches, respectively the first lateral capacitor is formed by the first well and by the first portion, separated by the first trench and the second lateral capacitor is formed by the first and second portions, separated by the second trench.

In accordance with yet another embodiment of the present disclosure, an ultrasonic transducer for an echographic apparatus is provided which comprises:
 at least a switch including first and second transistors coupled in series to each other and to relative intrinsic diodes in antiseries; and
 a driving configuration of said switch, wherein the driving circuit comprises: at least one first and one second output terminal coupled to the switch and configured to supply the switch with a first control signal for driving said switch in a first working state and a second control signal for driving said switch in a second working state, and in that it comprises at least one latch circuit coupled between respective common gate and source terminals of said first and second transistors and configured to supply said common gate terminal with said first and second control signals, respectively, according to said working state for the turn off, and respectively the turn on, of said first and second transistors, wherein said latch circuit comprises at least one flip-flop coupled to said common source terminal and having:
 a reset terminal coupled to said first output terminal of said driving device and to said common source terminal by means of a reset resistance;
 a set terminal coupled to said second output terminal of said driving device and to said common source terminal by means of a set resistance; and
 an output terminal coupled to said common gate terminal.
 said latch circuit further including an activation circuit connected to said set and reset terminals of the flip-flop and to said common source terminal in order to dynamically short-circuit said set and reset resistances during the falling edges of the signal applied to the switch.

BRIEF DESCRIPTION OF THE SEVERAL VIEWS OF THE DRAWINGS

The characteristics and the advantages of the driving configuration according to the invention will be apparent from the following description of an embodiment thereof given by way of indicative and non limiting example with reference to the annexed drawings, in which.

DETAILED DESCRIPTION

Figure 3:
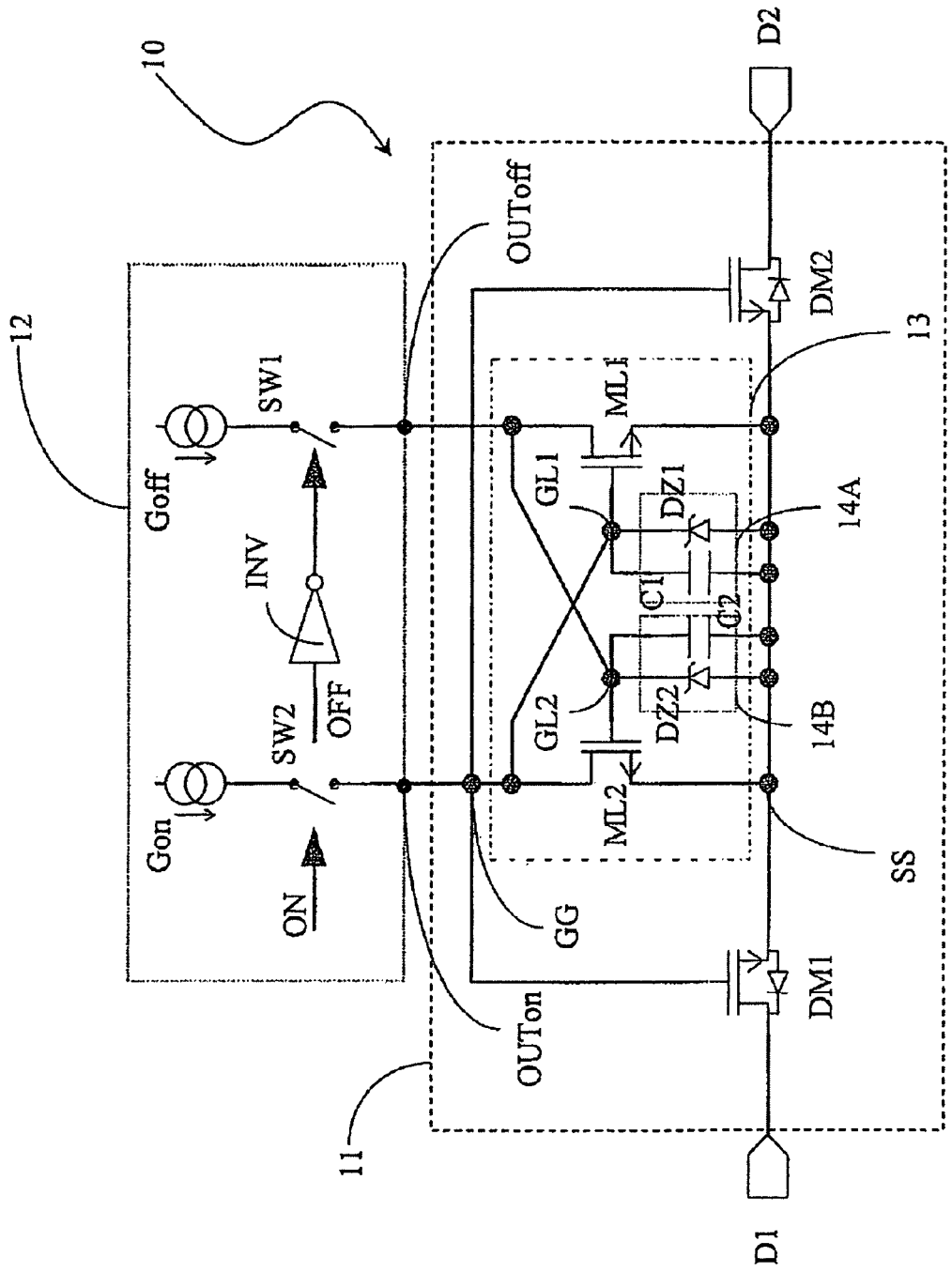
FIG. 3 schematically shows a driving configuration realized according to the present disclosure.

With reference to these figures, and in particular to FIG. 3, a driving configuration 10 that includes a high voltage switch 11 driven by a driving device or driver 11 is globally and schematically illustrated.

Figure 1:
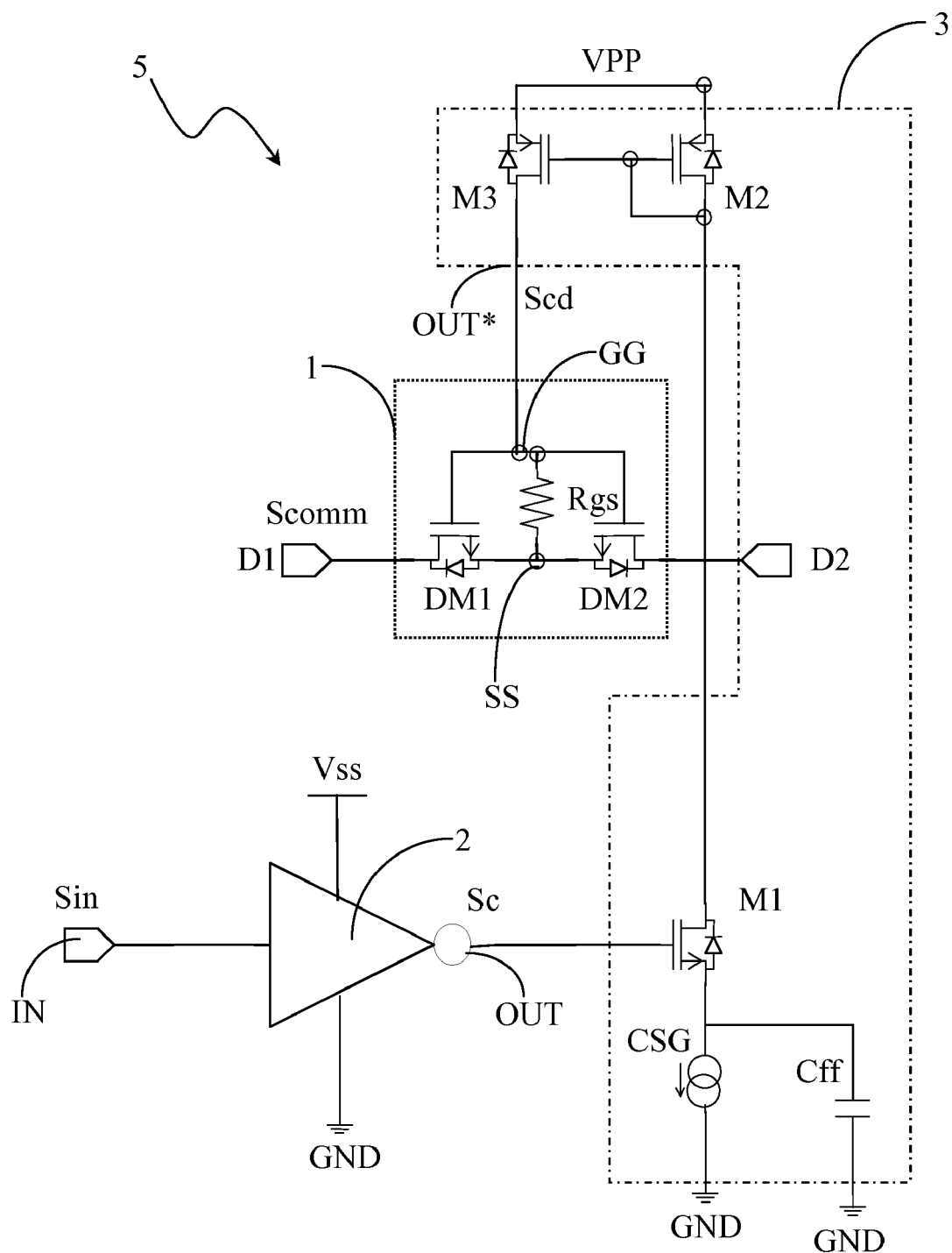
FIG. 1 schematically shows a driving configuration of a high voltage switch realized according to prior designs.
Figure 2A:
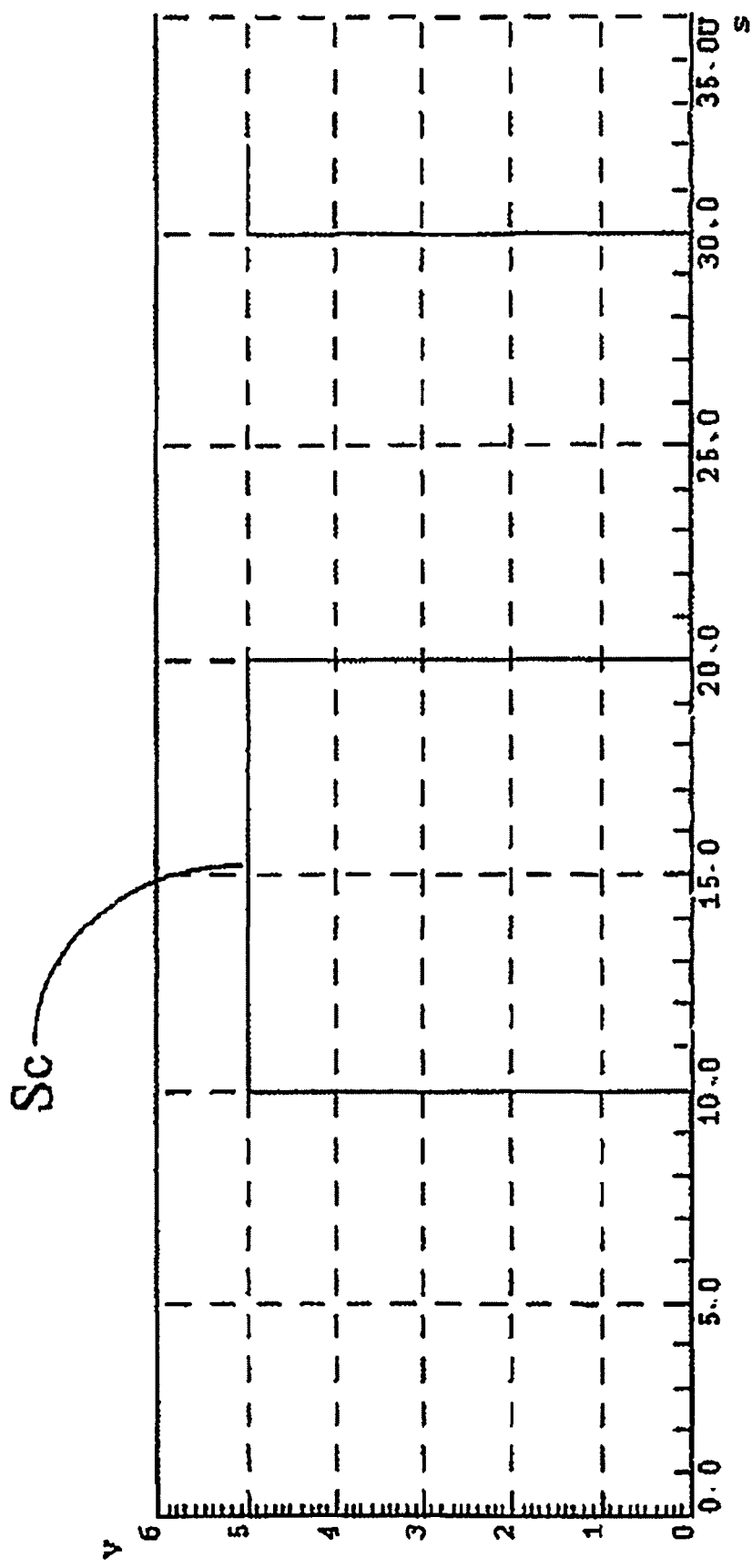
FIGS. 2A-2C show the results of a simulation carried out on the driving configuration of FIG. 1.
Figure 2B:
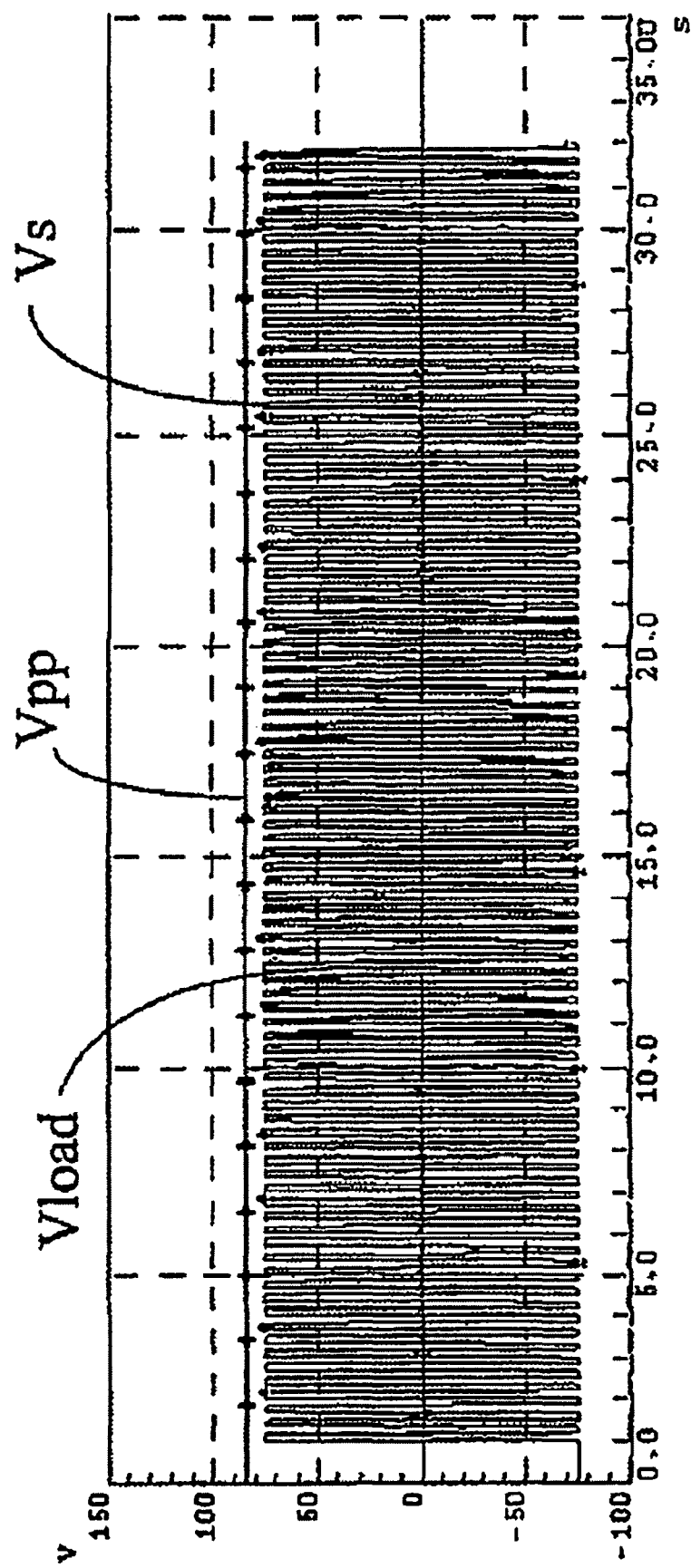
Figure 2C:
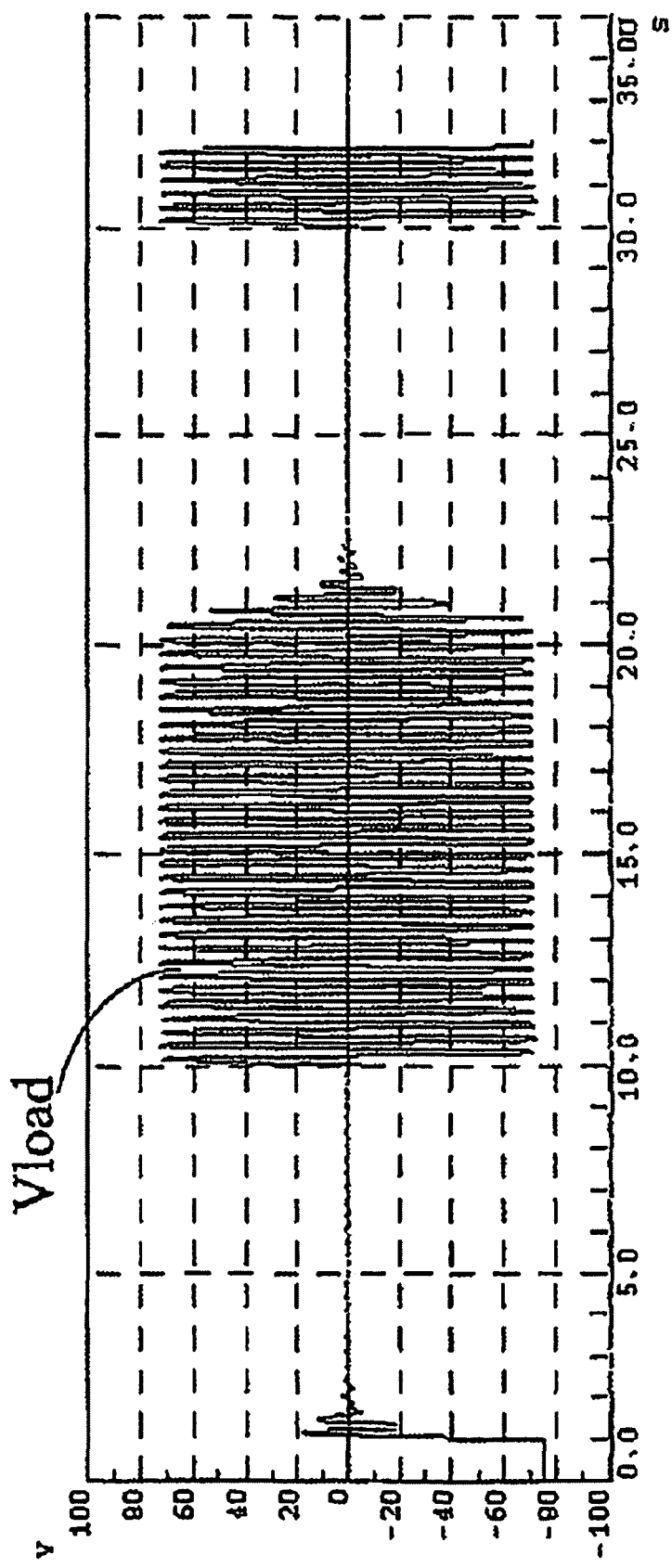

Elements structurally and functionally corresponding to the driving configuration described in relation to FIG. 1 will be given the same reference numbers by way of illustration.

In particular, the switch 11 includes first and second transistors, DM1 and DM2, in particular MOS or DMOS transistors, connected, in series to each other and to relative intrinsic diodes in antiseries, i.e., to a pair of corresponding terminals, in particular anodes, in common.

The driving device or driver 12 has first OUT"off" and second OUT"on" output terminals connected to the switch 11.

The driver 12 includes first Goff and second Gon control current generators connected, by respective first SW1 and second SW2 driven switches, to the first OUToff and second OUTon output terminals of the driver 12 itself. In particular, the first switch SW1 is driven, by an inverter INV, by a first turn off command OFF, while the second switch SW2 is driven by a second turn on command ON.

Advantageously according to this embodiment, the driving configuration 10 further includes a latch circuit 13 coupled between common respective source SS and gate GG terminals of the DM1 and DM2 transistors of the switch 11.

The latch circuit 13 has at least one first ML1 and one second ML2 latch transistor coupled between the source SS and gate GG terminals in positive reaction to each other, i.e., in latch configuration (more exactly, a semi-latch). In particular, the first latch transistor ML1 is coupled between the first output terminal OUToff of the driver 12 and the source terminal SS and it has a control or gate terminal GL1 connected to the gate terminal GG; similarly, the second latch transistor ML2 is coupled between the second output terminal OUTon of the driver 12, in turn connected to the gate terminal GG, and the source terminal SS and it has a control or gate terminal GL2 connected to the first output terminal OUToff of the driver 12.

The latch circuit 13 further includes a first Zener diode DZ1 and a first capacitor C1 coupled, in parallel to each other, between the gate terminal GL1 of the first latch transistor ML1 and the source terminal SS, as well as a second Zener diode DZ2 and a second capacitor C2 coupled, in parallel to each other, between the gate terminal GL2 of the second latch transistor ML2 and the source terminal SS.

In this way, advantageously according to this embodiment, the latch circuit 13 performs the functions of the resistive element Rgs coupled between the gate GG and source SS terminals of the driving configuration according to the prior art, ensuring a correct coupling of the gate terminals GG to suitable current values supplied by the driver 12 according to the working conditions of the driving configuration 10, i.e., when the switch 11 is driven to the turn off, and respectively to the turn on.

In fact, the latch transistors, ML1 and ML2, in the configuration provided for the latch circuit 13, work so as to turn off each other according to the working condition of the switch 11. These latch transistors are in particular N channel MOS transistors with low voltage (in particular, equal to 5V).

It is in fact evident that, due to the crossed coupling of the gate and drain terminals of the latch transistors, ML1 and ML2, the turn on of the first latch transistor ML1 causes the turn off of the second latch transistor ML2, since it nullifies its voltage value Vgs between the gate and source terminals, which are short-circuited to each other. Similarly, the turn on of the second latch transistor ML2 causes the turn off of the first latch transistor ML1, nullifying the voltage value Vgs between the gate and source terminals.

In this way, the value of the current injected by the control current generators, Goff and Gon, of the driver 12 closes itself on an infinite impedance (corresponding to the latch transistor when off) and thus, with a few µA of supplied current the driving configuration 10 according to the present disclosure is able to develop a voltage value sufficient to ensure a correct turn on, and respectively turn off, of the switch 11. The value of the voltage produced by the latch circuit 13 on the gate terminal of the latch transistor when on is clamped by to the diodes Zener, DZ1 and DZ2, and the capacitors, C1 and C2, connected between this gate terminal and the source terminal SS.

In other words, the Zener diode DZ1 and the capacitor C1 coupled to the gate terminal GL1 of the first latch transistor ML1 realize a clamp circuit 14A of a value of the current being on this gate terminal GL1. Similarly, the Zener diode DZ2 and the capacitor C2 connected to the gate terminal GL2 of the second latch transistor ML2 realize a further clamp circuit 14B of a voltage value on this gate terminal GL2.

Moreover, the capacitors, C1 and C2 coupled to the gate terminals GL1 and GL2 of the latch transistors, ML1 and ML2, are advantageously sized so as to overcome the parasitic capacitances of these gate terminals, ensuring in this way the maintenance of an ON or OFF state in the absence of a control signal.

Simulations carried out on the driving configuration 10 shown in FIG. 3 have shown switch times from an OFF state to an ON state substantially identical to those from the ON state to the OFF state, and on the order of 200 ns.

Figure 5A:
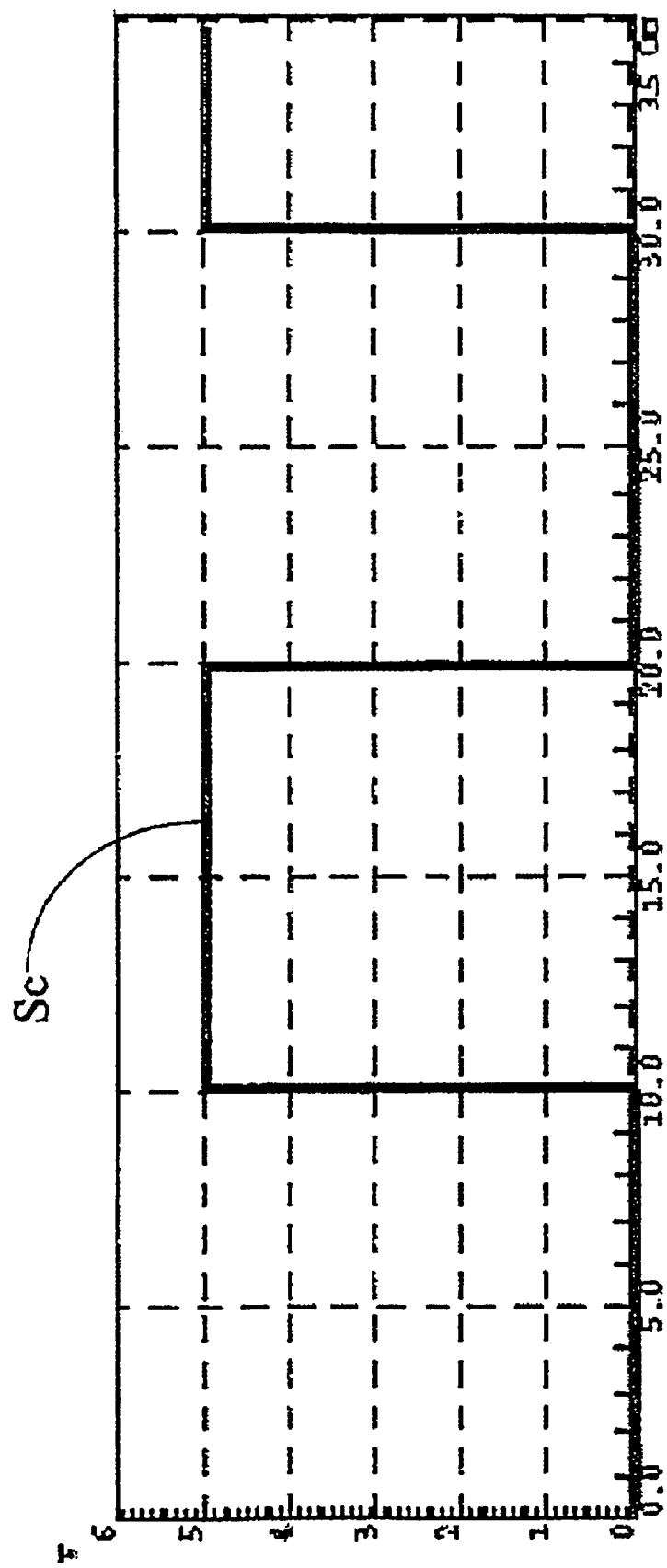
FIGS. 5A-5C show the results of a simulation carried out on the driving configuration of FIG. 3, FIG. 6 schematically shows yet another embodiment of the driving configuration according to the present disclosure.
Figure 5B:
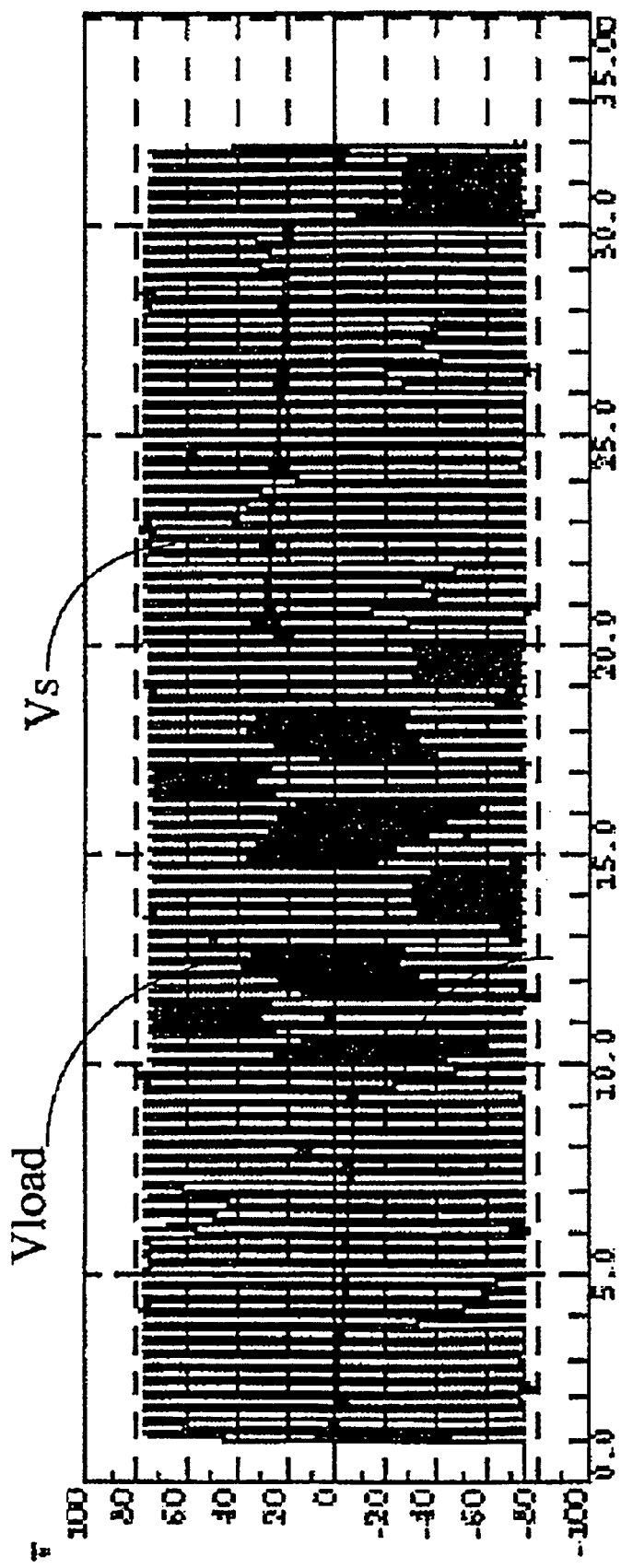
Figure 5C:
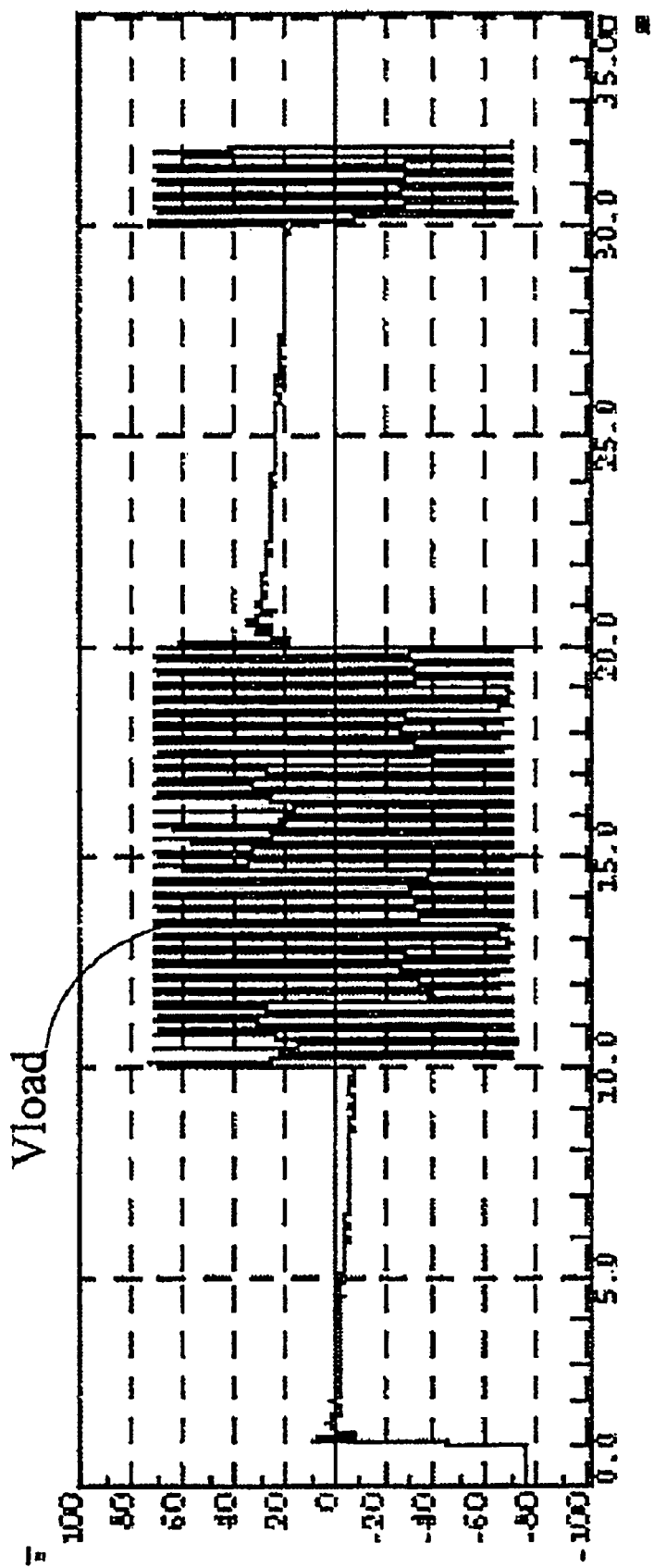

The results of these simulations are shown in FIGS. 5A-5C in which the switch 11 connects a load to a voltage signal source Vs. In particular, FIG. 5A shows a control signal Sc of the switch 11, for which a void voltage value (Sc=0) corresponds to a condition of an open switch, and a voltage value equal to Vpp (Sc=5V) corresponds to a condition of a closed switch. FIG. 5B shows the source voltage signal Vs and the voltage signal that is obtained on the load Vload, overlapped onto each other while FIG. 5C reports the signal on the load Vload only. Thus, it is verified that the switch 11 works correctly when on (signal Sc=5V) and reports the source voltage value Vs onto the load (Vs=Vload), as soon as the control signal Sc is brought to Vpp; moreover the switch 11 works correctly when off (signal Sc is brought to 0) and immediately unlatches the load as soon as the control voltage signal Sc is interrupted (at 20 microseconds in FIG. 5C).

In other words, the driving configuration 10 according to the present disclosure provides a quick switch transient for a switch driven in high voltage while achieving an unusual implementing simplicity.

Such a driving configuration, however, shows a considerable power dissipation, essentially due to the continuous charge/discharge of the capacitors, C1 and C2, connected to the gate terminals, GL1 and GL2, of the latch transistors, ML1 and ML2, of the latch circuit 13.

Moreover, it is problematic to obtain a current that crosses the channel of the latch transistor when on suitable to develop at least one threshold voltage so as to turn on the other latch transistor and to trigger a positive reaction.

Figure 4:
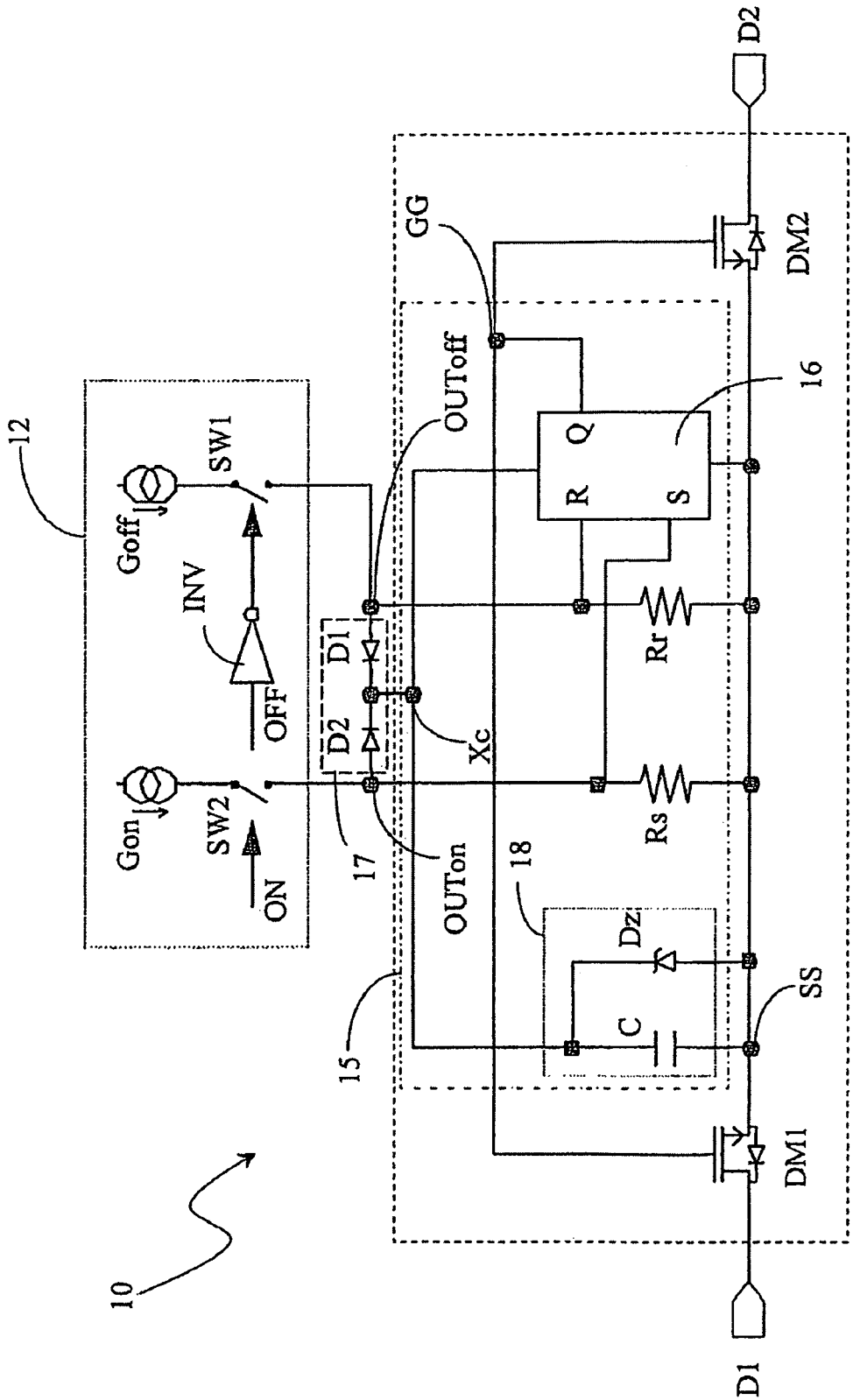
FIG. 4 schematically shows a further embodiment of the driving configuration according to the present disclosure.

An improving alternative embodiment of the driving configuration 10 according to the present disclosure is schematically shown in the embodiment of FIG. 4.

In particular, the driving configuration 10 includes a switch 11 driven by a driver 12 and has a latch circuit 15 inserted between the gate GG and source SS terminals of the transistors, DM1 and DM2, of the switch 11.

Advantageously according to this alternative embodiment, the latch circuit 15 includes a digital latch or flip-flop 16 of the Set/Reset type, usually realized with two logic gates of the NOR type.

In particular, the flip-flop 16 enables a change from an ON state to an OFF state simply by means of SET and RESET signals received as voltage signals across respective set Rs, and reset, Rr, resistances, suitably coupled to the set S and reset R terminals of the flip-flop 16.

More in detail, the flip-flop 16 is coupled between an inner circuit node Xc and the source terminal SS, and it has:
- a reset terminal R connected to the first output terminal OUToff of the driver 12, as well as to the source terminal SS by means of the reset resistance Rr;
- a set terminal S connected to the second output terminal OUTon of the driver 12, as well as to the source terminal SS by means of the set resistance Rs; and
- an output terminal Q connected to the gate terminal GG.

Further, the latch circuit 15 includes a Zener diode DZ and a capacitor C coupled, in parallel to each other, between the inner circuit node Xc and the source terminal SS. Also in this case, the Zener diode DZ and the capacitor C realize a clamp circuit 18 of the supply voltage value on the inner circuit node Xc.

In this way, advantageously according to this embodiment, the value of the current injected onto the set and reset resistances, Rs and Rr, by the driver 12 should not close itself on variable and unknown channel resistances. Thus, there is no need of over-sizing the elements of the circuit for ensuring always the correct switch of the DM1 and DM2 transistors, also in limit cases (so called worst cases).

In particular, it is to be emphasized that, due to the use of the latch circuit 15 with flip-flop 16, the value of the resistances involved in the driving of the DM1 and DM2 transistors are known and thus the current can be sized with greater precision and without waste.

The proposed driving configuration 10 is supplied with a supply voltage corresponding to the one necessary for the correct working of its components, in particular those used for realizing the NOR gates of the flip-flop 16.

To do this, the driving configuration 10 includes a rectifier 17 inserted between the output terminals, OUToff and OUTon, of the driver 12 and the supply inner circuit node Xc of the flip-flop 16. In particular, the rectifier 17 has a first diode D1 and a second diode D2 coupled in counter-series to each other, between these output terminals, OUToff and OUTon, and interconnected in correspondence with the inner circuit node Xc.

In this way, advantageously according to this embodiment, a supply voltage value for the flip-flop 16 is taken by rectifying a charge value of parasitic capacitances associated with the control current generators, Goff and Gon, comprised in the driver 12, this supply value being refreshed at each switch carried out by the switch 11.

In consequence, the capacitor C of the clamp circuit 18 is not continuously loaded and unloaded, but its energy is preserved for ensuring the state of the switch 11 for long periods of time.

Advantageously according to the present disclosure, the driving configuration 10 described with reference to FIG. 4 realizes the driving for a high voltage switch able to associate, with the characteristic of low current consumption, a quick switching transient or time.

Such a driving configuration is also able to correctly operate for a signal applied to the switch 11, i.e. the signal generated at the first OUToff and second OUTon output terminals by the driver 12, when this signal has a slew rate up to 2000V/us. However, it shows fake logic switches when the signal slew rate overcomes 2000V/us. These fake switches are tied to the parasitic capacitors associated to the Set and Reset terminals, S and R, of the flip-flop 16.

Figure 6:
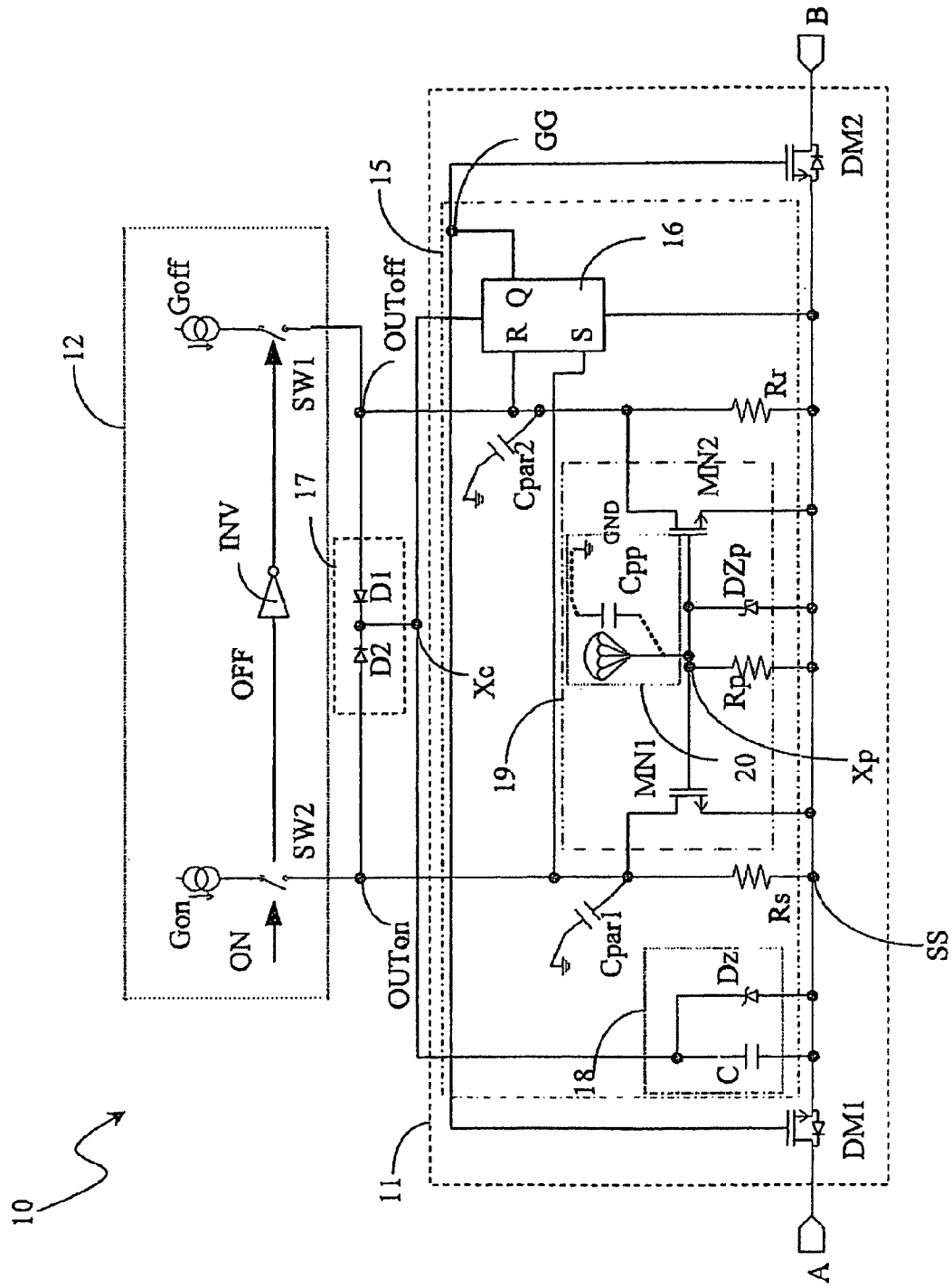

In other words, during the falling edges having a high slew rate of the signal applied to the switch 11, the parasitic capacitors associated to such S and R terminals, indicated in FIG. 6 as Cpar1 and Cpar2, respectively, which discharge through the set and reset resistances, Rs and Rr, have across their ends voltage values, Vs and Vr, equal to:

$$Vs = Rs * slope * Cpar1; \text{ and}$$

$$Vr = Rr * slope * Cpar2,$$

where slope is the slew rate of the signal applied to the switch 11 and Cpar1, Cpar2 are the capacitance values of the parasitic capacitors of the Set and Reset terminals, with respect to the substrate of the integrated structure realizing the driving configuration 10.

Due to the above explained parasitic configuration, if the voltage values Vs and Vr are sufficiently high (>2V) to overcome the triggering threshold voltage value of the latch circuit 15, they cause wrong or fake Set or Reset commands.

A simple solution to overcome this problem could be to dramatically reduce the resistive values of the Set and Reset resistances, Rs and Rr. This would however lead to a higher current which is to be generated from the Set and Reset generators and thus to an increase of their area, which would consequently lead to a higher power consumption of the latch circuit 15 as a whole.

An further alternative embodiment of the driving configuration 10 according to the present disclosure is schematically shown in the embodiment of FIG. 6.

Advantageously according to this further alternative embodiment, the latch circuit 15 further includes an activation circuit 19 connected to the Set and Reset terminals of the flip-flop 16 and to the source terminal SS of the transistors, DM1 and DM2, of the switch 11.

In particular, the activation circuit 19 comprises a first MOS transistor MN1, namely an N-Channel MOS transistor, inserted between the Set terminal S and the source terminal SS and having a gate terminal connected to an inner circuit node Xp as well as a second MOS transistor MN2, namely an N-Channel MOS transistor, inserted between the Reset terminal R and the source terminal SS and having a gate terminal connected to the inner circuit node Xp. Moreover, the inner circuit node Xp is connected to the source terminal SS by means of a resistor Rp and a Zener Diode Dzp, in parallel to each other.

Also, advantageously according to this further alternative embodiment, the activation circuit 19 comprises a "brake" circuit 20, suitably connected to the inner circuit node Xp and to the ground GND and acting as a "parachute" for the Set and Reset resistances, Rs and Rr, of the flip-flop 16.

More particularly, the "brake" circuit 20 is realized by means of a high voltage parasitic capacitor Cpp, suitably obtained in the integrated structure realizing the driving configuration 10 by a dummy Nwell showing a parasitic capacitor Cpp with respect to the substrate of the integrated structure, which is isolated by means of oxide trenches, as will be explained in more detail in the following description.

In this way, advantageously according to this alternative embodiment, the Set and Reset resistances, Rs and Rr, are dynamically short-circuited during the falling edges of the signal applied to the switch 11. So, advantageously according to this embodiment, the Set and Reset resistances, Rs and Rr, have their nominal values also in the absence of the signal applied to the switch 11 and thus during the programming step of the latch circuit 15.

Moreover, it is to be emphasized that, due to the use of the activation circuit 19, the physical phenomenon which allows the Set and Reset resistances, Rs and Rr, to be short-circuited is exactly the one which generates the fake switches tied to the parasitic capacitors Cpar1 and Cpar2 associated to the Set and Reset terminals of the flip-flop 16 and thus is correctly synchronous with it.

In particular, the "brake" circuit 20 activates the MOS transistors MN1 and MN2 which allow the Set and Reset resistances, Rs and Rr, to be short-circuited or at least to be dramatically reduced in value.

In practice, the "brake" circuit 20, acting as a parachute during the falling edges of the signal applied to the switch 11, brakes the corresponding voltage edges at the gate terminals of the MOS transistors MN1 and MN2 of the activation circuit 19, which are suitably low voltage transistors. In this way, a sufficiently high voltage-source voltage Vgs is applied to them, causing them to turn on.

Simulations carried out on the driving configuration 10 of FIG. 6 have shown a correct operation of the same with applied signals having a slew rate up to 10000 V/us, which is the maximum slew rate value obtainable by the commonly used test apparatus, without showing any failure.

Figure 7:
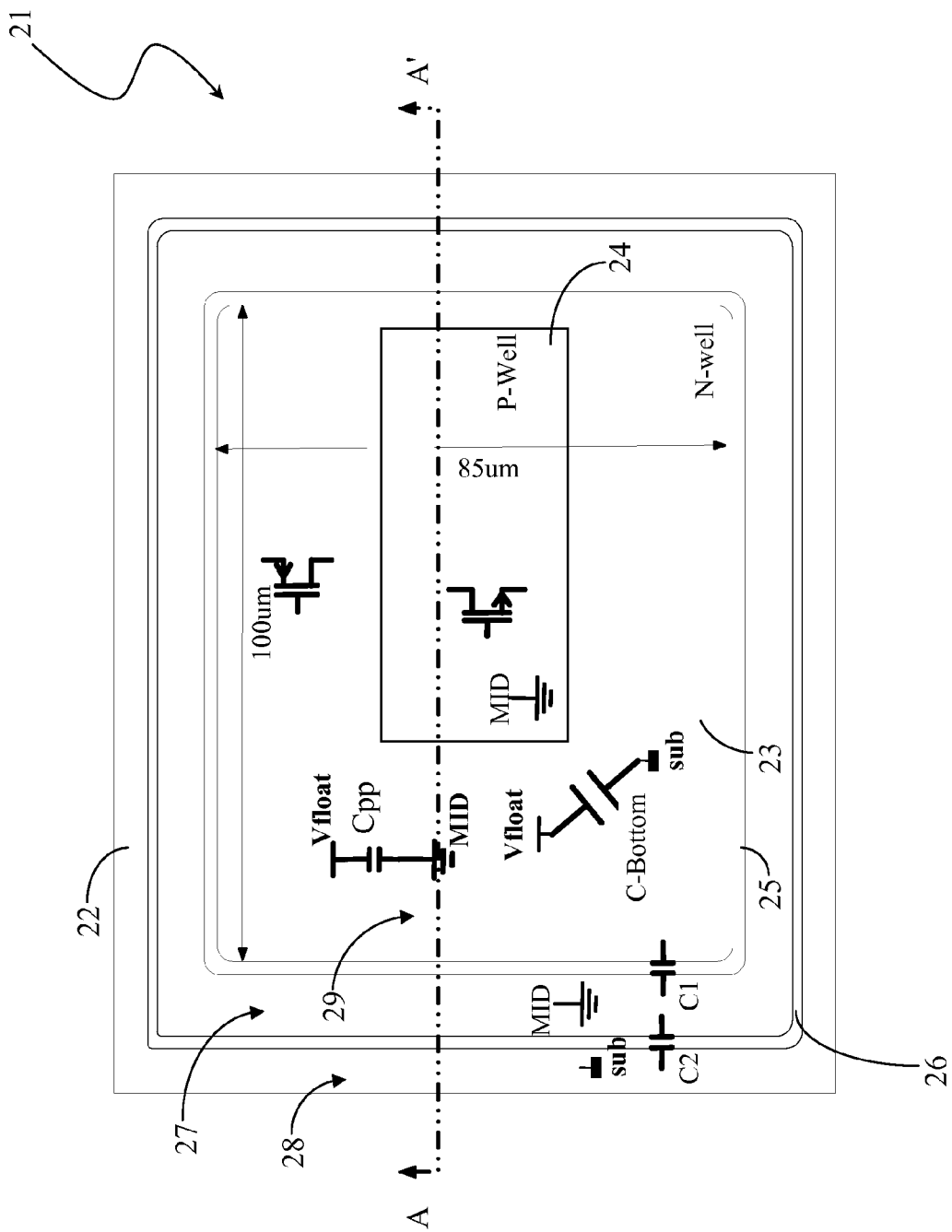
FIG. 7 schematically shows a top view of an integrated layout of the driving configuration of FIG. 6.

In particular, according to yet another embodiment, the driving configuration is realized in an integrated structure, as schematically shown in FIG. 7, the integrated structure being globally indicated with 21.

More in particular, the integrated structure 21 is of the SOI type and comprises a substrate 22 wherein a first well, in particular the N-well 23 is realized. Moreover, the integrated structure 21 also comprises a second well, in particular a P-well 24, realized within the N-well 23.

In this way, the N-well 23 realizes the body of the P-channel transistors of the driving configuration 10 while the P-well 24 realizes the body of the N-channel transistors thereof. In particular, the switch 11 is realized in the P-well 24. The N-well 23 is a dummy well used to realize the "brake" circuit 20 and in particular the capacitor Cpp.

Advantageously according to this embodiment, the integrated structure 21 also comprises a first 25 and a second trench 26, having substantial ring shapes and surrounding the P-well 24 in order to isolate a silicon area around the sensitive pocket wherein the driving configuration 10 is realized. More in particular, the first 25 and second trenches 26 define a first 27 and a second portion 28 of the substrate 22, the first portion 27 of the substrate 22 being laterally fully isolated by the first and second trenches 25 and 26.

Figure 8:
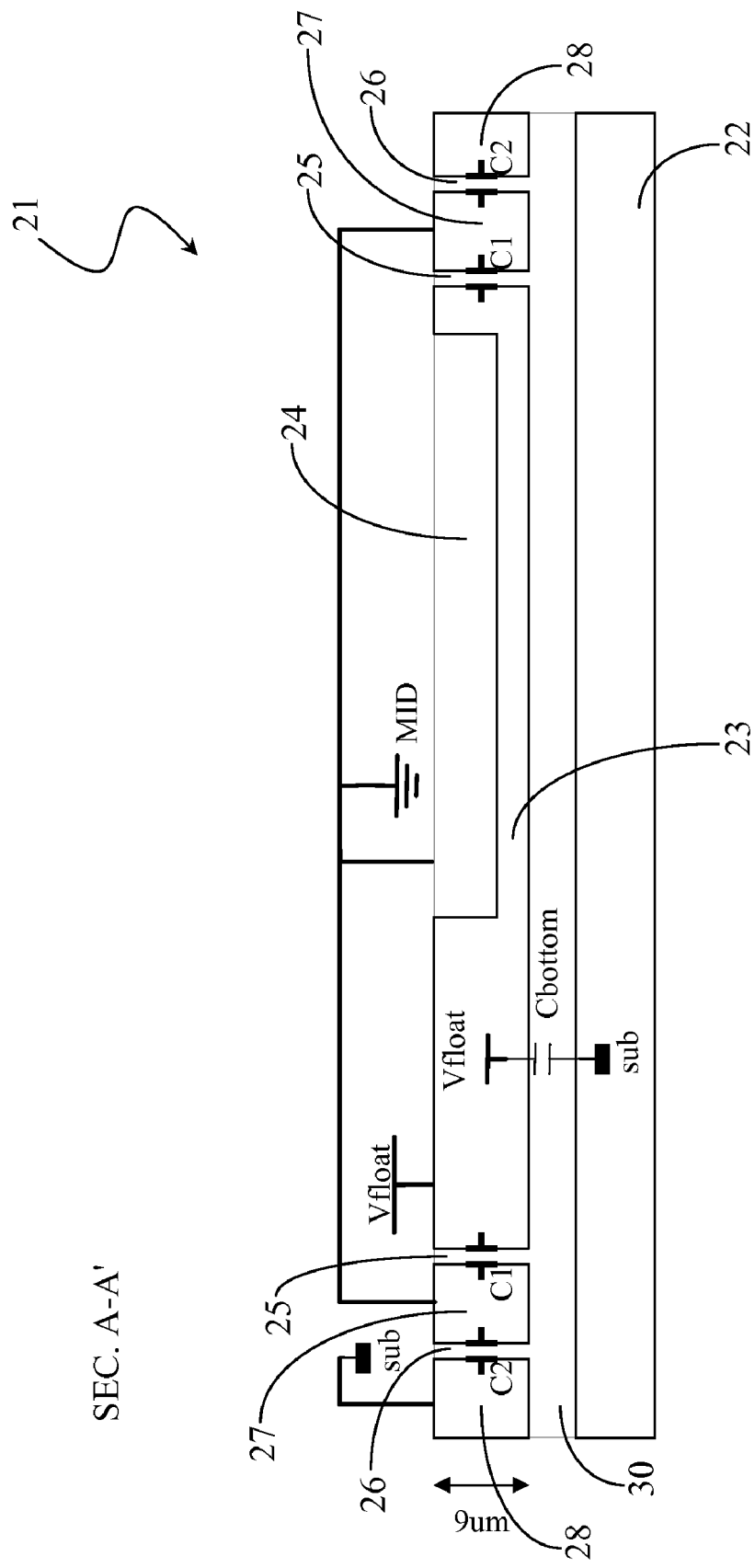
FIG. 8 schematically shows a section view of the integrated layout of FIG. 7.

Moreover, as schematically shown in FIG. 8, which is a vertical section view of the integrated structure 21 of FIG. 7, taken according to the line AA' indicated therein, such an integrated structure 21 also comprises an isolation layer 30, being realized according to the SOI technology.

In this way, the first portion 27 of the substrate 22 is fully isolated, laterally by the trenches 25 and 26 and vertically by the SOI isolation layer 30.

Advantageously according to this embodiment, the trenches 25 and 26 are filled by silicon oxide and have a thickness of 1 µm, thus having capacitance of 35 aF/µm$^2$, while the isolation layer 30, also made by silicon oxide, has a thickness of 2 µm, thus having capacitance of 17 aF/µm$^2$.

Advantageously according to this embodiment, the P-Well 24 and the first portion 27 of the substrate 22 are connected to a local ground line MID, while the N-Well 23 is connected to a local supply line Vfloat and the second portion 28 of the substrate 22 is connected to a substrate terminal sub. It is important to note that, during the operation of the integrated structure 21, the local ground line MID is raised up to 90V, while the local supply line Vfloat is tied to it by the capacitor Cpp to follow the local ground line MID and thus rises up to 95V.

Thanks to this connection to the local ground line MID, which is the local digital ground of the switch 11, the first portion 27 of the substrate 22 is flying with, i.e. follows, the signal applied to the switch 11 and it is driven by the signal generator.

In particular, as indicated in FIGS. 7 and 8, a bottom capacitor Cbottom is realized by the N-Well 23 and the substrate 22, separated by the isolation layer 30. In particular, this bottom capacitor Cbottom is thus connected between the local supply line Vfloat and the substrate terminal sub.

Also, lateral capacitors C1 and C2 are formed across the trenches 25 and 26. More particularly, a first lateral capacitor C1 is formed by the N-Well 23 and by the first portion 27 of the substrate 22, separated by the first trench 25, while a second lateral capacitor C2 is formed by the first and second portions, 27 and 28, of the substrate 22, separated by the second trench 26.

In this way, the lateral capacitors do not sink energy from the local supply line Vfloat, being connected in parallel to the capacitor Cpp and thus give an extremely positive contribution like a feed-forward structure.

It is important to note that the driving configuration 10 is particularly useful when realizing ultrasonic transducers, in particular for echographic apparatuses.

As is well known, ultrasonic sensors (also known as transducers when they both send and receive) work on a principle similar to radar or sonar which evaluate attributes of a target by interpreting the echoes from radio or sound waves respectively. In particular, the ultrasonic transducers comprises generators of high frequency sound waves and evaluation circuit of the echo which is received back by the transducers, which calculate the time interval between sending the signal and receiving the echo to determine the distance to an object.

These transducers are usefully applied, for instance, to the medical ultrasonography. In particular, the ultrasonography or diagnostic sonography is an ultrasound-based diagnostic imaging technique used to visualize muscles and internal organs, their size, structures and possible pathologies or lesions. Obstetric ultrasonography is commonly used during pregnancy and is widely recognized by the public, but there are a plethora of diagnostic and therapeutic applications practiced in medicine by means of the ultrasonography and by means of a corresponding echographic apparatus.

In particular, an ultrasonic transducer for an echographic apparatus comprises at least a switch 11 driven by a driving configuration 10 according to one of the embodiments above explained.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated structure comprising:
a first well realized in a substrate;
a second well realized within the first well, said first and second wells having respectively first and second conductivity types, opposite to each other;
a switch realized in the second well;
first and second trenches surrounding the second well and defining a sensitive pocket, wherein the first and second trenches define a first portion and a second portion of the substrate, the first portion being laterally isolated by the first and second trenches, and wherein the second well and the first portion are connected to a local ground line, the first well is connected to a local supply line, and the second portion is connected to a substrate terminal;
an SOI isolation layer configured to vertically isolate the first portion;
a driving circuit realized in the sensitive pocket and configured to drive said switch; and
a bottom capacitor which is realized by the first well and by the substrate, separated by the SOI isolation layer and connected between the local supply line and the substrate terminal.

2. The integrated structure according to claim 1 wherein the first and second trenches are filled by silicon oxide and have a thickness of 1 μm and the isolation layer is made by silicon oxide and has a thickness of 2 μm.

3. The integrated structure according to claim 1 further comprising first and second lateral capacitors formed across the first and second trenches, the first lateral capacitor being formed by the first well and by the first portion, separated by the first trench, and the second lateral capacitor being formed by the first and second portions, separated by the second trench.

4. A latch circuit, comprising
a set resistance and a reset resistance;
a first circuit node;
a flip-flop including:
a reset terminal coupled to the circuit node by the reset resistance;
a set terminal coupled to said first circuit node by the set resistance, the reset and set terminals being configured to be driven by first and second control signals, respectively; and
an output terminal; and
an activation circuit coupled to said set and reset terminals of the flip-flop and to said first circuit node and configured to dynamically short-circuit said set and reset resistances during falling edges of at least one of the first and second control signals, wherein the activation circuit is formed in an integrated structure that includes:
a first well realized in a substrate;
a second well realized within the first well, said first and second wells having respectively first and second conductivity types, opposite to each other;
first and second trenches surrounding the second well and defining a sensitive pocket, wherein the first and second trenches define a first portion and a second portion of the substrate, the first portion being laterally isolated by the first and second trenches, and wherein the second well and the first portion are connected to a local ground line, the first well is connected to a local supply line, and the second portion is connected to a substrate terminal;
an SOI isolation layer configured to vertically isolate the first portion; and
a bottom capacitor which is realized by the first well and by the substrate, separated by the SOI isolation layer and connected between the local supply line and the substrate terminal.

5. The latch circuit according to claim 4, wherein said activation circuit comprises:
a first MOS transistor coupled between said set terminal and the first circuit node and having a gate terminal connected to an inner circuit node; and
a second MOS transistor coupled between said reset terminal and said first circuit node terminal and having a gate terminal connected to said inner circuit node, the first and second MOS transistors being formed in the second well.

6. The latch circuit according to claim 5, wherein said first and second MOS transistors are low voltage N channel MOS transistors.

7. The latch circuit according to claim 5, wherein activation circuit includes a resistor and a Zener diode in parallel to each other an coupled between said inner circuit node and said first circuit node.

8. The latch circuit according to claim 5, wherein said activation circuit further comprises a brake circuit coupled to said inner circuit node and configured to activate said first and second MOS transistors which allow said set and reset resistances to be at least substantially short-circuited, the brake circuit being formed in first well.

9. The latch circuit according to claim 8, wherein said brake circuit includes a high voltage parasitic capacitor formed in the first well.

10. An integrated circuit, comprising
a first well realized in a substrate;
a second well realized within the first well, said first and second wells having respectively first and second conductivity types, opposite to each other;
first and second trenches surrounding the second well and defining a sensitive pocket;
a first switch that includes first and second transistors coupled to each other and including first and second intrinsic diodes, respectively, the first and second transistors being formed in the second well;

a driving circuit formed in the sensitive pocket and configured to drive the first and second transistors, the driving circuit including first and second output terminals coupled to the switch and configured to supply the first switch with a first control signal for driving said first switch in a first working state and a second control signal for driving said first switch in a second working state; and a latch circuit coupled between respective common gate and source terminals of said first and second transistors and configured to supply said common gate terminal with said first and second control signals, respectively, according to said working state for turning off, and respectively turning on, said first and second transistors, wherein said latch circuit includes:

a set resistance and a reset resistance;

a flip-flop coupled to said common source terminal and having:
  a reset terminal coupled to said first output terminal of said driving device and to said common source terminal by the reset resistance;
  a set terminal coupled to said second output terminal of said driving device and to said common source terminal by the set resistance; and
  an output terminal coupled to said common gate terminal; and an activation circuit coupled to said set and reset terminals of the flip-flop and to said common source terminal and configured to dynamically short-circuit said set and reset resistances during falling edges of at least one of the first and second control signals applied to the switch.

11. The integrated circuit according to claim 10, wherein said activation circuit comprises:
  a first MOS transistor coupled between said set terminal and said common source terminal and having a gate terminal connected to an inner circuit node; and
  a second MOS transistor coupled between said reset terminal and said common source terminal and having a gate terminal connected to said inner circuit node, the first and second MOS transistors being formed in the second well.

12. The integrated circuit according to claim 11, wherein said first and second MOS transistors are low voltage N channel MOS transistors.

13. The integrated circuit according to claim 11, wherein the activation circuit includes a resistor and a Zener diode in parallel to each other and coupled between said inner circuit node and said common source terminal.

14. The integrated circuit according to claim 11, wherein said activation circuit further comprises a brake circuit formed in the first well, coupled to said inner circuit node, and configured to activate said first and second MOS transistors which allow said set and reset resistances to be at least substantially short-circuited.

15. The integrated circuit according to claim 14, wherein said brake circuit includes a high voltage parasitic capacitor formed in the first well.

16. The integrated circuit according to claim 10, further comprising a rectifier coupled between said first and second output terminals of said driving device and a circuit node configured to supply said flip-flop.

17. The integrated circuit according to claim 16, wherein said rectifier comprises first and second diodes coupled in counter-series to each other and between said first and second output terminals of said driving device and interconnected to each other in correspondence with said circuit node.

18. The integrated circuit according to claim 16, further comprising a clamp circuit coupled between said circuit node and said common source terminal.

19. The integrated circuit according to claim 18, wherein said clamp circuit comprises a Zener diode and a capacitor coupled in parallel to each other and between said circuit node and said common source terminal.

20. The integrated circuit according to claim 10, wherein said first switch comprises a high voltage switch.

21. The integrated circuit according to claim 10, wherein said first and second transistors are DMOS transistors.

22. An integrated circuit, comprising
  a first well realized in a substrate;
  a second well realized within the first well, said first and second wells having respectively first and second conductivity types, opposite to each other;
  first and second trenches surrounding the second well and defining a sensitive pocket;
  a switch that includes first and second transistors coupled to each other, the first and second transistors being formed in the second well;
  a driving circuit formed in the sensitive pocket, said driving circuit configured to drive said switch in a first working state by supplying the first and second transistors with a first control signal and said driving circuit further configured to drive said switch in a second working state by supplying the first and second transistors with a second control signal; and
  a latch circuit coupled between respective common gate and source terminals of the first and second transistors.

23. The integrated circuit according to claim 22 wherein said latch circuit is configured to supply said common gate terminal with said first and second control signals, respectively, according to said working state for turning off, and respectively turning on, said first and second transistors.

24. The integrated circuit according to claim 22, said latch circuit further comprising
  a set resistance and a reset resistance;
  a flip-flop coupled to said common source terminal and having:
    a reset terminal coupled to said driving circuit and to said common source terminal by the reset resistance;
    a set terminal coupled to said driving circuit and to said common source terminal by the set resistance; and
    an output terminal coupled to said common gate terminal; and
  an activation circuit coupled to said set and reset terminals of the flip-flop and to said common source terminal and configured to dynamically short-circuit said set and reset resistances during falling edges of at least one of the first and second control signals.

25. The integrated circuit according to claim 24, wherein the activation circuit includes a resistor and a Zener diode in parallel to each other and coupled between an inner circuit node and said common source terminal.

26. The integrated circuit according to claim 25, wherein the activation circuit includes a brake circuit formed in the first well, coupled to the inner circuit node, and configured to substantially short-circuit the set and reset resistances via activation of the first and second transistors.

* * * * *